United States Patent [19]
Spuler et al.

[11] Patent Number: 5,935,873
[45] Date of Patent: Aug. 10, 1999

[54] DEPOSITION OF CARBON INTO NITRIDE LAYER FOR IMPROVED SELECTIVITY OF OXIDE TO NITRIDE ETCHRATE FOR SELF ALIGNED CONTACT ETCHING

[75] Inventors: Bruno Spuler, Wappingers Falls; Juergen Wittmann, Fishkill; Martin Gutsche, Poughkeepsie; Wolfgang Bergner, Wappingers Falls, all of N.Y.; Matthias Ilg, Richmond, Va.

[73] Assignee: Siemens Aktiengesellschaft, Munich, Germany

[21] Appl. No.: 08/939,148
[22] Filed: Sep. 29, 1997
[51] Int. Cl.⁶ .......................... C23C 14/00; C23C 14/48
[52] U.S. Cl. .............................. 438/710; 438/724
[58] Field of Search ..................... 438/710, 514

[56] References Cited

U.S. PATENT DOCUMENTS

| | | | |
|---|---|---|---|
| 5,096,842 | 3/1992 | Nihira et al. | 437/31 |
| 5,244,822 | 9/1993 | Nihira et al. | 437/31 |
| 5,556,506 | 9/1996 | Contreras et al. | 438/710 |

*Primary Examiner*—Robert Kunemund
*Assistant Examiner*—Lynette T. Umez-Eronini
*Attorney, Agent, or Firm*—Stanton C. Braden

[57] ABSTRACT

A method for forming a Self Aligned Contact in a semiconductor device includes incorporating carbon into a nitride layer during or following the formation of the nitride layer on a semiconductor substrate.

22 Claims, 2 Drawing Sheets

DEPOSITION OF CARBON INTO NITRIDE LAYER FOR IMPROVED SELECTIVITY OF OXIDE TO NITRIDE ETCHRATE FOR SELF ALIGNED CONTACT ETCHING

BACKGROUND

1. Technical Field

This disclosure relates to methods for providing a desired selectivity of oxide to nitride etchrate when forming a Self Aligned Contact (SAC) in a semiconductor device. More particularly, the selectivity of oxide to nitride etchrate is provided by depositing carbon into at least a portion of a nitride layer in the semiconductor device prior to etching.

2. Background of Related Art

Etching to form a Self Aligned Contact (SAC) on a semiconductor device is known. To produce a satisfactory SAC, a high etchrate selectivity of oxide to nitride is required. Unless adequate etchrate selectivity is provided, a well defined corner is not formed in the SAC and the semiconductor device is subject to failure and/or unreliability. Presently, corner selectivities of 20:1 can be achieved using a $C_4F_8$/CO/Ar chemistry to perform the etching. However, several disadvantages are associated with use of CO in the etch chemistry such as, for example, metal contamination and difficult handling. Unfortunately, removing CO from the etch chemistry results in poor corner selectivity and hence poor quality product.

It therefore would be desirable to provide a desired selectivity of oxide to nitride etchrate during SAC etching without the use of CO-containing chemistry.

SUMMARY OF THE INVENTION

Novel methods for providing a desired selectivity of oxide to nitride etchrate during formation of a Self Aligned Contact in a semiconductor device have been discovered. The methods include forming at least a nitride layer on a semiconductor substrate and incorporating carbon into at least a portion of the nitride layer during or following the formation of the nitride layer.

In a particularly useful embodiment, the method includes the steps of providing a semiconductor substrate having a top surface with a first opening formed therein; forming a nitride layer on at least a portion of the top surface of the semiconductor substrate and within the first opening; incorporating carbon into at least a portion of the nitride layer to produce a carbonized nitride layer; forming an oxide layer on the carbonized nitride layer to substantially fill the first opening; and etching the oxide layer to expose the carbonized nitride layer and provide a contact opening.

DESCRIPTION OF THE INVENTION

In accordance with the methods described herein, a semiconductor device having a structure substantially free of poorly defined corners at the interface of the oxide and nitride layer can be produced. The desired corner selectivity is achieved without CO-containing etch chemistry by utilizing a carbonized silicon nitride layer. In this manner, the selectivity of oxide to nitride etchrate is improved and corner selectivities of 20:1 can be achieved without the disadvantages of having CO in the etch chemistry.

Figure 1:
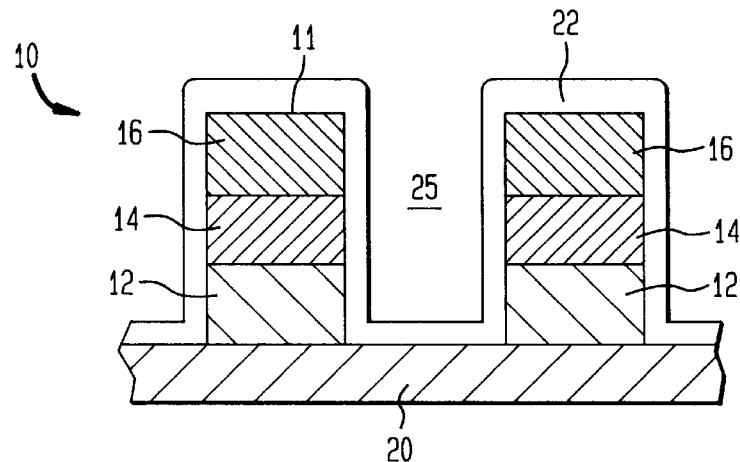
FIG. 1 is a schematic cross-sectional view of a semiconductor substrate having an opening and a layer of silicon nitride formed thereon.

Referring to FIG. 1, the method involves providing a semiconductor substrate 10 having a top surface 11 and an opening 25 formed therein. Typically, the semiconductor substrate 10 will include a silicon wafer 20 and one or more layers of materials, such as, for example, the three material layers 12, 14 and 16 on silicon wafer 20. Semiconductor substrate 10 used in the method described herein is of the conventional type and may contain, for example, circuitry and other interconnection levels. Suitable materials for the three material layers 12, 14 and 16 can include any conventional material known to one skilled in the art,. Preferred materials include but are not limited to polysilicon for material layer 12, metal silicide, such as $WSi_x$, for material layer 14 and Gate Cap $Si_3N_4$ for material layer 16. Techniques and parameters for forming material layers 12, 14 and 16 on wafer 20 (e.g., time, temperature, thickness, etc.) are within the purview of one skilled in the art.

Opening 25 is formed in semiconductor substrate 10 by techniques known to those skilled in the art. For example, a resist layer (not shown) can be applied to the top surface 11 of the device 20. The resist layer is patterned and developed using known photolithographic techniques. Then etching is conducted to form opening 25, such as, by employing a suitable anisotropic etching technique, e.g., reactive ion etching. A desired width of each opening 25 will normally vary according to the current-carrying requirements for a given conductor, i.e., the conductive material that will eventually be used in the SAC as discussed hereinbelow. A preferred width of each opening 25 will ordinarily range from about 0.5 to about 0.05 µm and preferably from about 0.2 to about 0.10 µm.

Following formation of opening 25, a nitride layer 22, e.g., $Si_3N_4$, is advantageously formed onto the surface of semiconductor substrate 10 within each opening 25 and over the top surface 11 of the device 10. The nitride layer 22 will ordinarily have a thickness ranging from about 0.05 to about 0.02 µm, preferably from about 0.03 to about 0.02 µm. The nitride layer 22 can be formed by employing known and conventional procedures, e.g., low pressure chemical vapor deposition.

Figure 2:
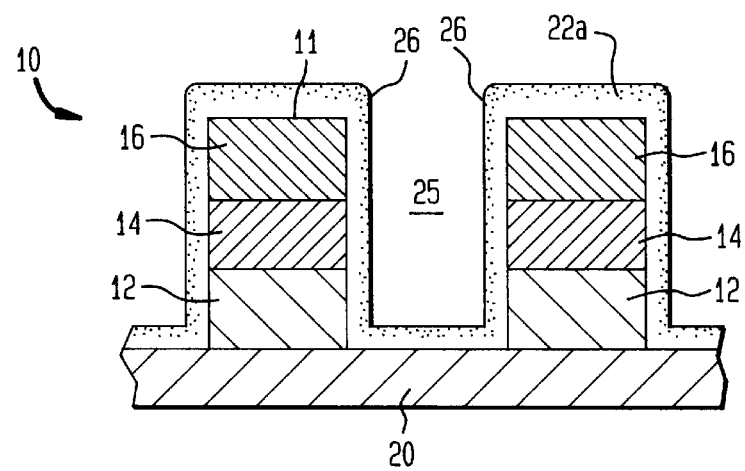
FIG. 2 is a schematic cross-sectional view similar to FIG. 1 showing carbon incorporated into the nitride layer.

Carbon is advantageously incorporated into at least a portion of the nitride layer 22 to provide carbonized nitride layer 22a as seen in FIG. 2. The incorporation of carbon into the nitride layer 22 will substantially reduce the nitride etch rate during subsequent etching processes thus protecting material layer 16 and thereby maintaining a satisfactorily sharp corner 26.

Carbon can be incorporated into layer 22 using any suitable technique. For example, carbon can be incorporated into layer 22 during deposition of layer 22. To add carbon during the formation of the nitride layer 22, a carbon-containing gas, e.g., methane or other hydrocarbon, can be included in the gas mixture employed during chemical vapor deposition of $Si_3N_4$. The concentration of hydrocarbon gas employed will depend on a number of factors including the particular hydrocarbon gas chosen, the amount of carbon to be incorporated, and the composition and thickness of layer 22. For a $Si_3N_4$ layer deposited using a gas mixture containing methane as the carbon-containing gas, the concentration of methane gas will range from about 1% to about 50%, preferably from about 10% to about 30% by weight based on the total content of the nitrogen and methane gas. The amount of carbon incorporated into the carbonized nitride layer 22a will ordinarily range from about 1% to about 50%, preferably from about 10 to about 30%.

It is also contemplated that carbon can be incorporated into layer 22 after layer 22 has been deposited using any suitable technique such as, for example, ion implantation. Typically, ion implantation is performed using, e.g., carbon as the ion seed. To accelerate the ions during ion implantation, an acceleration voltage is used to bombard the ions into the nitride layer 22. The ion implantation is ordinarily performed at an acceleration voltage from about 1 kv to about 25 kv at a dose of from about $1 E^{13}$ to about $1 E^{16}$. If desired, the carbon can be implanted into only a portion of the nitride layer 22, by, e.g., applying a mask over the nitride layer 22, utilizing photolithography, employing a suitable anisotropic etching technique such as reactive ion etching and then performing ion implantation.

Figure 3:
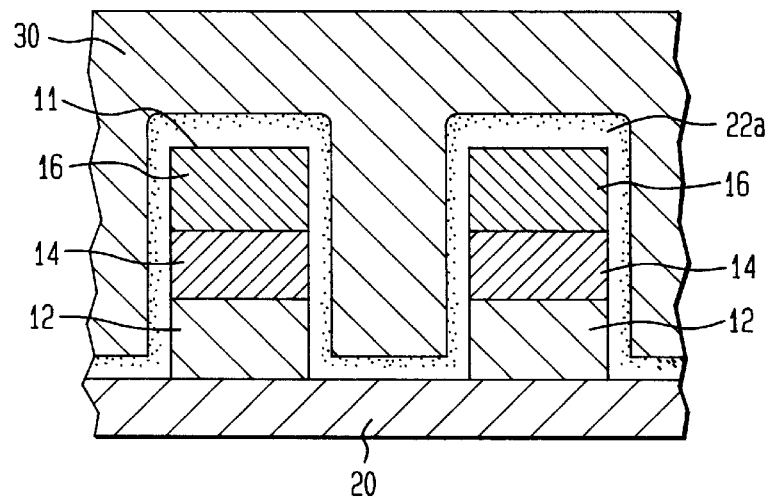
FIG. 3 is a schematic cross-sectional view similar to FIG. 1 showing an oxide layer formed on the carbonized nitride layer.

Following formation of the carbonized nitride layer 22a, an oxide layer 30 is then formed on the surface of the carbonized nitride layer 22a (See FIG. 3). The thickness of the oxide layer 30 will range from about 0.4 to about 1 $\mu$m. The oxide layer 30 used can include any suitable oxide material known to those skilled in the art. A preferred oxide material used in the method described herein is silicon dioxide. The oxide layer 30 can be formed by known and conventional procedures such as, e.g., plasma enhanced chemical vapor deposition. As one skilled in the art will readily appreciate, subsequent layers, e.g., APEX, can optionally be formed on the top surface of oxide layer 30.

Figure 4:
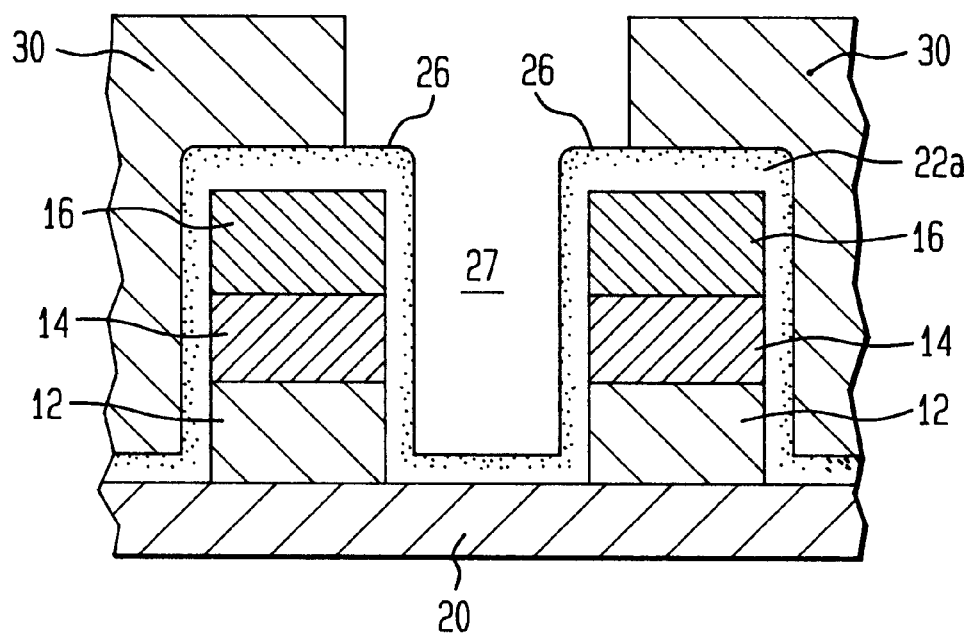
FIG. 4 is a schematic cross-sectional view similar to FIG. 1 showing the etched contact opening.

Referring to FIG. 4, once the oxide layer 30 has been formed onto the top surface of the carbonized nitride layer 22a, contact opening 27 is then created in the oxide layer 30 (or on subsequent layers optionally formed on the top surface of the oxide layer 30) by etching. As recognized by one skilled in the art, contact opening 27 will be patterned by first applying a mask (not shown) onto oxide layer 30, or any layer subsequently formed on the top surface of oxide layer 30, utilizing photolithography and then etching. The etchant used for the SAC etching can ordinarily be the $C_4F_8$/Ar chemistry known to those skilled in the art, however any etch chemistry suitable for etching $Si_3N_4$ and/or oxide layers which provides the desired selectivity can also be employed.

As noted above, by implanting carbon into the nitride layer 22, the nitride etchrate will be substantially reduced such that the oxide layer 30 will have an etchrate substantially greater than the etchrate of the carbonized nitride layer 22a. When the etching is then performed to form contact opening 27, the selectivity of oxide to nitride etchrate can ordinarily be in a ratio from about 5 to about 30, preferably from about 10 to about 20 and more preferably from about 10 to about 15. Thus, corner selectivities of from about 5 to about 20, preferably from about 10 to about 15 can be achieved. The result of these achieved corner selectivities is that a sharper corner 26 is advantageously formed and maintained at the interface of the oxide layer 30 and carbonized nitride layer 22a following the SAC etching. The benefit of the sharp corner 26 is that the carbonized nitride layer 22a can protect the material layer 16, e.g., Gate Cap $Si_3N_x$, from short circuiting when opening 27 is subsequently filled with a conductive material (e.g., W, Al, Cu or combinations thereof) and a current is eventually provided therethrough.

Although the invention has been described in its preferred form with a certain degree of particularity, obviously many changes and variations are possible therein and will be apparent to those skilled in the art after reading the foregoing description. It is therefore to be understood that the present invention may be presented otherwise than as specifically described herein without departing from the spirit and scope thereof.

What is claimed is:

1. A method for forming a contact opening for a Self Aligned Contact in a semiconductor device comprising:

providing a semiconductor substrate having a top surface with an opening formed therein;

forming a nitride layer on at least a portion of the top surface and within the opening; and incorporating carbon into at least a portion of the nitride layer to form a carbonized nitride layer.

2. The method of claim 1 wherein the opening in the top surface of the semiconductor substrate and the nitride layer are formed substantially.

3. The method of claim 2 wherein the nitride layer is formed by a chemical vapor deposition technique in the presence of a carbon-containing gas.

4. The method of claim 3 wherein the carbon-containing gas is methane.

5. The method of claim 1 wherein the nitride layer is silicon nitride.

6. The method of claim 1 wherein the carbon is deposited into the nitride layer following the formation of the nitride layer.

7. The method of claim 6 wherein carbon is incorporated into the nitride layer using ion implantation.

8. The method of claim 1 wherein the amount of carbon incorporated into the nitride layer is in the range of from about 1 to about 50%.

9. The method of claim 1 further comprising the steps of:

forming an oxide layer on the carbonized nitride layer; and etching the oxide layer to provide a contact opening.

10. The method of claim 9 wherein the oxide layer is silicon dioxide.

11. The method of claim 9 wherein $C_4F_8$/Ar chemistry is used in the etching step.

12. A method for forming a Self Aligned Contact in a semiconductor device comprising:

providing a semiconductor substrate, having a top surface with a first opening formed therein;

forming a nitride layer on at least a portion of the top surface of the semiconductor substrate and within the first opening;

incorporating carbon into at least a portion of the nitride layer to produce a carbonized nitride layer;

forming an oxide layer on the carbonized nitride layer to substantially fill the first opening; and etching the oxide layer to expose the carbonized nitride layer and form a contact opening.

13. The method of claim 12 wherein the opening in the top surface of the semiconductor substrate and the nitride layer are formed substantially.

14. The method of claim 13 wherein the nitride layer is formed by a chemical vapor deposition technique in the presence of a carbon-containing gas.

15. The method of claim 14 wherein the carbon-containing gas is methane.

16. The method of claim 12 wherein the nitride layer is silicon nitride.

17. The method of claim 12 wherein the carbon is deposited into the nitride layer following the formation of the nitride layer.

18. The method of claim 17 wherein carbon is incorporated into the nitride layer using ion implantation.

19. The method of claim 12 wherein the amount of carbon incorporated into the nitride layer is in the range of from about 1 to about 50%.

20. The method of claim 12 wherein the oxide layer is silicon dioxide.

21. The method of claim 12 wherein $C_4F_8$/Ar chemistry is used in the etching step.

22. The method of claim 12 wherein the semiconductor substrate includes a silicon wafer having at lest three layers sequentially deposited thereon, the three layers comprising a polysilicon layer, a WSi layer and a gate cap $Si_3N_4$ layer, and wherein the first opening extends through the three layers to expose the silicon wafer.

* * * * *